(12) United States Patent
Sullivan

(10) Patent No.: US 9,933,480 B2
(45) Date of Patent: Apr. 3, 2018

(54) PARAMETRIC PIN MEASUREMENT UNIT HIGH VOLTAGE EXTENSION

(71) Applicant: ELEVATE SEMICONDUCTOR, INC., San Diego, CA (US)

(72) Inventor: Patrick G. Sullivan, Forestville, CA (US)

(73) Assignee: Elevate Semiconductor, Inc., San Diego, CA (US)

( * ) Notice: Subject to any disclaimer, the term of this patent is extended or adjusted under 35 U.S.C. 154(b) by 155 days.

(21) Appl. No.: 14/860,643

(22) Filed: Sep. 21, 2015

(65) Prior Publication Data

US 2016/0084883 A1  Mar. 24, 2016

Related U.S. Application Data

(60) Provisional application No. 62/052,958, filed on Sep. 19, 2014.

(51) Int. Cl.
*G01R 1/30* (2006.01)
*G01R 31/28* (2006.01)
*G01R 31/30* (2006.01)
*G01R 19/00* (2006.01)

(52) U.S. Cl.
CPC ..... *G01R 31/3004* (2013.01); *G01R 19/0092* (2013.01); *G01R 31/2834* (2013.01); *G01R 31/2851* (2013.01)

(58) Field of Classification Search
CPC ......... G01R 31/31924; G01R 31/3004; H02M 3/157

USPC ................ 323/282; 324/762.01, 762.02, 537
See application file for complete search history.

(56) References Cited

U.S. PATENT DOCUMENTS

| | | | | |
|---|---|---|---|---|
| 5,357,156 A * | 10/1994 | Herrington | .......... | H03G 11/002 327/103 |
| 5,414,352 A * | 5/1995 | Tanase | ................ | G01R 31/2851 324/73.1 |
| 5,844,913 A * | 12/1998 | Hassoun | .......... | G01R 31/31924 324/537 |
| 6,008,664 A * | 12/1999 | Jett | ..................... | G01R 19/0023 324/762.02 |
| 8,717,051 B2 * | 5/2014 | Sullivan | ............. | G01R 19/0092 323/314 |
| 2006/0082359 A1 * | 4/2006 | Chow | .................... | G01R 19/00 324/762.01 |
| 2007/0210810 A1 * | 9/2007 | Balke | ............... | G01R 31/31924 324/713 |

* cited by examiner

*Primary Examiner* — Jonathan Han
(74) *Attorney, Agent, or Firm* — Craig M. Stainbrook; Stainbrook & Stainbrook, LLP

(57) ABSTRACT

An integrated circuit for measuring a signal, including a parametric pin measurement unit (PPMU) that sends a forced signal, the PPMU having a first amplifier, a second amplifier with an output terminal connected to the input terminals of the first amplifier through a common resistor; a voltage-to-current convertor connected to a PPMU output and having a first output and a second output; n channel MOSFETs connected to the first output of the voltage-to-current converter; p channel MOSFETs connected to the second output of the voltage-to-current converter; a buffered amplifier connected to an output port between the n channel MOSFETs and the p channel MOSFETs; and a resistance divider connected to the output of the buffered amplifier.

38 Claims, 2 Drawing Sheets

PARAMETRIC PIN MEASUREMENT UNIT HIGH VOLTAGE EXTENSION

CROSS REFERENCES TO RELATED APPLICATIONS

Not applicable. The present application claims the benefit of the filing date of U.S. Provisional Patent Application Ser. No. 62/052,958, filed Sep. 19, 2014 (Sep. 19, 2014), which application is incorporated in its entirety by reference herein.

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION BY REFERENCE OF MATERIAL SUBMITTED ON A COMPACT DISC

Not applicable.

BACKGROUND OF THE INVENTION

Field of the Invention

The present invention relates generally to integrated circuits for use in automated test equipment, and more particularly to a parametric pin measurement unit high voltage extension circuit for use in highly integrated system-on-chip pin electronics ICs that incorporate a variety of analog functions with digital support functionality for automated test equipment and ASIC verification.

Background Discussion

Traditionally automated test equipment integrated chip manufacturers have sought to achieve greater circuit density by integrating DACs, timing, drivers, comparators, loads, and PPMUs on a single chip. The limitation is that many applications require high voltage functions, which require very large high voltage devices. These large devices are usually not available in standard low voltage CMOS processes, and those that are available push the die size up, push the yield down, and generally limit the degree of integration achieved by the device. For example, a 5V PPMU can be integrated into a complex design in a low voltage process, but a 120+V PPMU might not be able to be integrated, either due to the process limitations or cost limitations.

BRIEF SUMMARY OF THE INVENTION

The present invention uses a traditional low voltage, yet highly integrated PPMU. This degree of integration is achieved in other automated test equipment chips. For applications requiring higher voltages than are currently manageable on automated test equipment chips, such as with automotive test equipment, the present invention provides the advantage of adding minimal circuitry to provide a high voltage PPMU function for a limited number of pins. This HV PPMU must be able to accurately force a voltage and measure a current and, conversely, to accurately force a current and measure a voltage.

Because PPMUs developed in a given process are limited in voltage range by the process breakdown voltage, the present invention allows an extension of the voltage range with minimal addition of devices while still retaining the full feature set of the lower voltage PPMU. This feature set includes programmable voltage and current levels, current limiting and voltage limiting.

BRIEF DESCRIPTION OF SEVERAL VIEWS OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1:
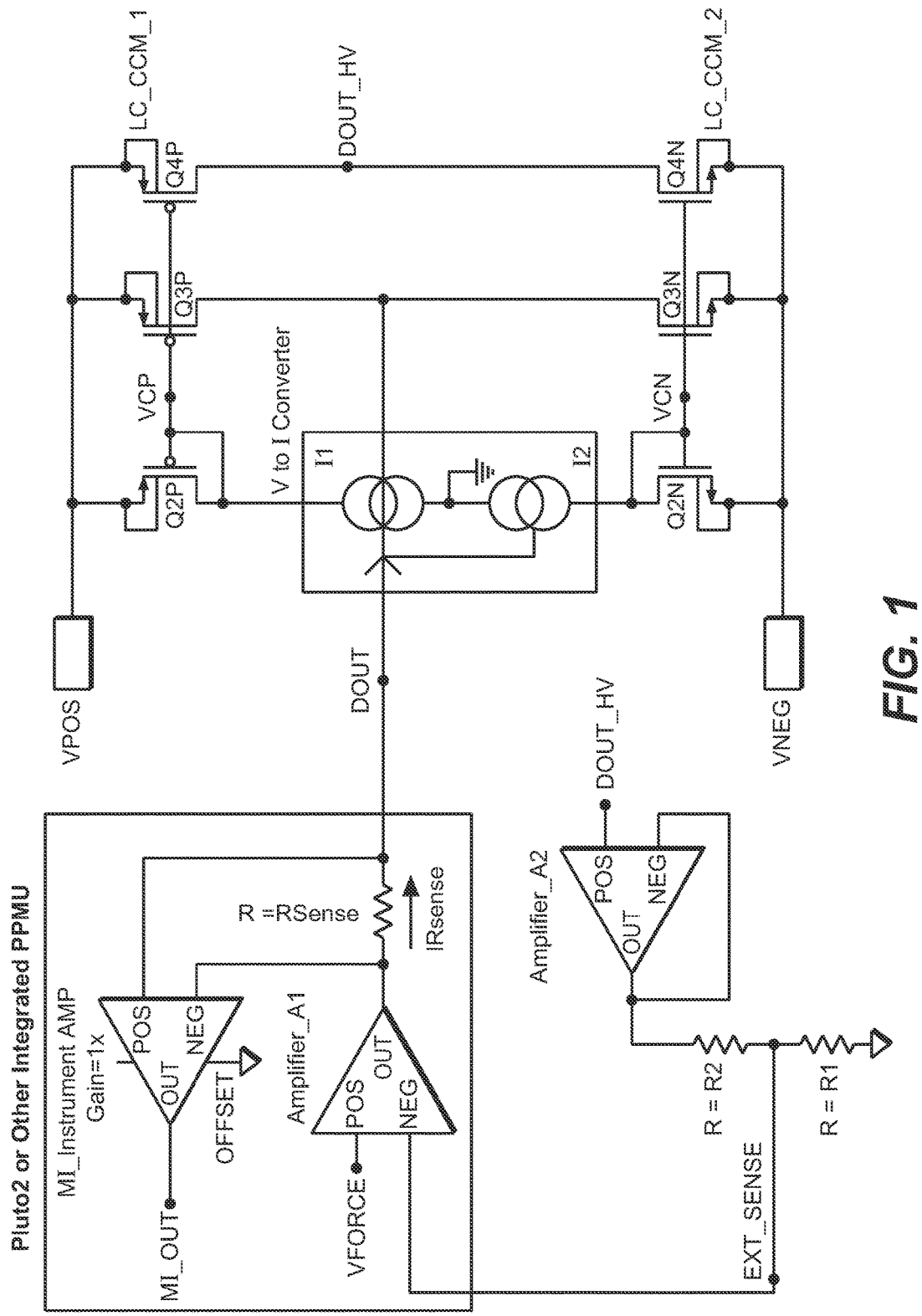
FIG. 1 is a schematic diagram showing the pin parametric measurement unit integrated circuit of the present invention, shown in the "force voltage" mode.
Figure 2:
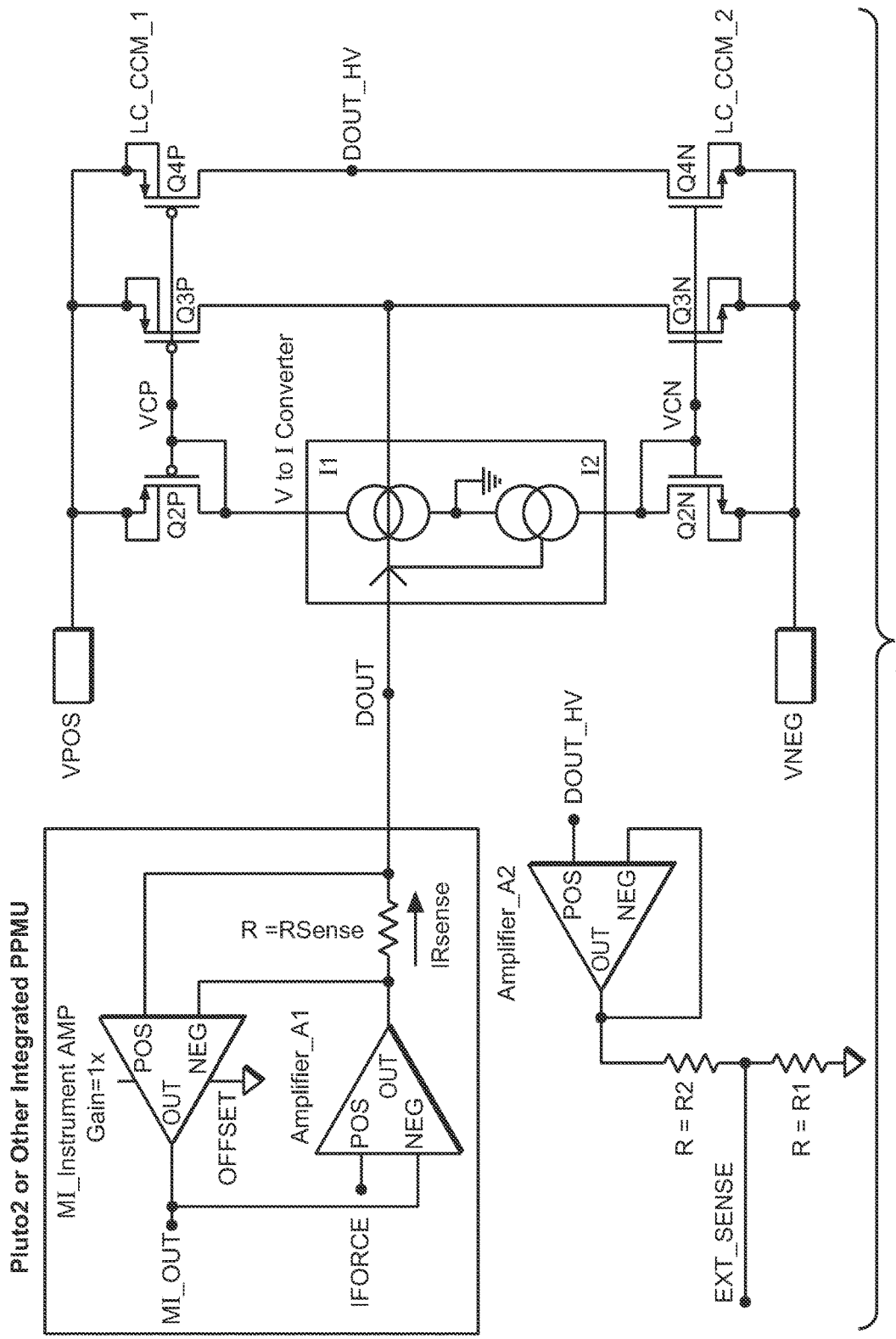
FIG. 2 is a schematic diagram showing the inventive circuit in the "force current" mode.

Referring to FIGS. 1 and 2, there is illustrated therein a new and improved pin parametric measurement unit integrated circuit, the force voltage mode generally denominated 100 herein (FIG. 1) and the force current mode generally denominated 200 herein (FIG. 2).

Referring first to FIG. 1, the circuitry in the box labeled "Integrated PPMU" is representative of a parametric measurement unit ("PPMU") found on integrated products currently available. Four functions are needed to fulfill the HV PPMU function. They are described as follows:

Voltage Force:

First, Amplifier_A1 is used to force a voltage at DOUT. The voltage forced at DOUT is determined by the feedback node EXT_SENSE. EXT_SENSE is determined by the output node DOUT_HV which is buffered by Amplifier_A2 and then divided by resistor divider comprised of R1 and R2. The value of EXT_SENSE is given as follows:

$$\text{EXT\_SENSE} = \text{DOUT\_HV} * 1 * R1/(R1+R2)$$

V to I Converter:

The voltage-to-current converter ("V to I") converter takes the voltage output DOUT of the integrated PPMU and converts it to a pair of currents I1 and I2. Currents are defined by DOUT as follows:

DOUT<=0V, I1=IQ, where IQ is a minimal quiescent current.

I2=DOUT/R+IQ

DOUT>=0, I2=IQ

I1=DOUT/R+IQ, where R is set to provide maximum desired output current.

Current Mirror and Measure:

Q2P, Q3P, Q4P make up a current mirror, where current that flows in Q2P is reflected in Q3P and Q4P. Similarly, Q2N, Q3N, Q4N make up a current mirror, where current that flows in Q2N is reflected in Q3N and Q4N. The circuits are symmetrical and will behave similarly for rising/falling DOUT voltage. Q2P is gate-drain connected and also connected to I1 of the voltage-to-current converter V to I converter described above. As current I1 increases, current in Q4P increases and drives the output DOUT_HV higher. Similarly Q2N is gate drain connected and connected to I2 of the voltage-to-current converter V to I converter. As DOUT voltage falls the current will increase in Q2N and Q4N pulling the DOUT_HV node lower. DOUT will be driven by Amplifier_A1 until VForce=Ext_Sense. By substitution with equation 1, VForce=DOUT_HV*R1/R1+R2 or $$DOUT\_HV = VForce*(R1+R2)/R1.$$

Measure Current:

Traditionally the measure current function is performed by measuring the voltage across a known resistor Rsense with an instrumentation amplifier. The output MI_OUT would be given by Irsense*Rsense. IOUT is then calculated as IOUT=IRSENSE=MI_OUT/RSENSE. In this case the concern is to measure the current in the DOUT_HV output not necessarily the DOUT pin. To measure the current at the DOUT_HV pin, it will be noted that a similar current will flow in Q3P and Q3N, thus the sum of the currents in Q3N and Q3P will accurately represent the sum of the currents in Q4P and Q4N. IOUT is given by IQ4P-IQ4N. DOUT is tied to the drains of Q3P and Q3N and is low impedance therefore the current that flows in DOUT will be a representation of the current flowing in DOUT_HV. This representative current will flow through RSENSE and therefore can be measured by the MI instrumentation amplifier MI_Instrument_AMP.

$$IOUT\_HV=IRSENSE=MI\_OUT/RSENSE.$$

Force Current:

Force current is set in an extended PPMU in the same manner as in an integrated PPMU. The EXT_SENSE feedback to the Amplifier_A1 is opened. The MI_OUT signal is fed back to the negative input of Amplifier_A1. This is shown in FIG. 2. IFORCE is set to a voltage that represents the desired output current. DOUT will go up/down in voltage to increase/decrease the current in I1 and decrease/increase the current in I2. This will increase/decrease the current sourced by Q3P and decrease/increase the current in Q3N until the current in RSENSE is such that MI_OUT=IFORCE. Given the scaling of Q3P/Q4P=1 and Q3N/Q4N=1, an equivalent current will be flowing in the DOUT_HV output. Since IOUT=MI_OUT/RSENSE, and MI_OUT=IFORCE as described above, IFORCE can be substituted for MI_OUT to get IOUT=IFORCE/RSENSE. Measure voltage can be performed by measuring the voltage at EXT SENSE, because EXT_SENSE=DOUT_HV*1*R1/(R1+R2).

Then, it is possible to calculate DOUT_HV=EXT_SENSE*(R1+R2)1R1.

High Z:

It will also be desirable to have the HVPPMU go into a HiZ or Hi Impedance state. This is achieved by turning the V to I converter off and allowing the diodes Q3P, Q3N to pull the gates of Q4P and Q4N to the VPOS and VNEG rails respectively. This will turn off the output devices Q4P and Q4N, leaving DOUT_HV to be a Hi Impedance node.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. An integrated circuit (IC) assembly for measuring a signal, comprising:
   a low voltage integrated parametric pin measurement unit ("PPMU") having a current limit range and a voltage limit range and configured to send a forced signal, said PPMU having a first amplifier and a second amplifier with an output terminal of said second amplifier connected to the input terminals of said first amplifier through a common resistor connected therebetween, said PPMU having an output force terminal;
   a PPMU high voltage extension coupled to said output force terminal and including:
      (a) a voltage-to-current convertor connected to said output force terminal said voltage-to-current converter having a first output and a second output;
      (b) a plurality of n channel MOSFETs connected to said first output of said voltage-to-current converter;
      (c) a plurality of p channel MOSFETs connected to said second output of said voltage-to-current converter;
      (d) a buffered amplifier connected to an output port between said plurality of n channel MOSFETs and said plurality of p channel MOSFETs and having an output applied to a terminal of said second amplifier of said PPMU; and
      (e) a resistance divider connected to said output of said buffered amplifier, said resistance divider having a first resistor and a second resistor;
   wherein said PPMU extension is configured to extend the voltage range or the current range of said PPMU to enable measurement of signal voltages higher than the voltage range of said PPMU while retaining the full feature set of said low voltage PPMU.

2. The integrated circuit (IC) assembly of claim 1, wherein when a forced voltage is given at the positive terminal of said second amplifier and an output from said buffered amplifier is applied to the negative terminal of said second amplifier, a forced voltage mode of said parametric pin measurement unit results.

3. The integrated circuit (IC) assembly of claim 1, wherein when a voltage representing a forced current is given at said negative terminal of said second amplifier and an output from said first amplifier is applied to the positive terminal of said second amplifier, a forced current mode of said parametric pin measurement unit results.

4. The integrated circuit (IC) assembly of claim 1, wherein said plurality of n channel MOSFETs and the plurality of p channel MOSFETs acts as a current mirroring circuit.

5. The integrated circuit (IC) assembly of claim 1, wherein at least one of said plurality of n channel MOSFETs and at least one of said plurality of p channel MOSFETs are gate-drain connected.

6. An integrated circuit (IC) for measuring a high current range, comprising:
   a parametric pin measurement unit ("PPMU") having a first amplifier and a second amplifier with the output terminal of said second amplifier applied to the input terminals of said first amplifier through a common resistor connected therebetween;
   a voltage-to-current converter connected to an output of said PPMU, said voltage-to-current converter having a first output and a second output;

a plurality of n channel MOSFETs connected to said first output of said voltage-to-current converter;

a plurality of p channel MOSFETs connected to said second output of said voltage-to-current converter;

a buffered amplifier connected to an output port between said plurality of n channel MOSFETs and said plurality of p channel MOSFETs; and a resistance divider having a first resistor and a second resistor connected to said output of said buffered amplifier, said resistance divider providing a feedback signal to the negative terminal of said second amplifier;

whereby when a forced voltage (VFORCE) is applied to the positive terminal of said second amplifier, current beyond the current range of said PPMU can be measured from the output port between said plurality of n channel MOSFETs and said plurality of p channel MOSFETs.

7. The integrated circuit (IC) of claim 6, wherein the forced voltage (VFORCE) applied to the positive terminal of said second amplifier is determined from the voltage of said feedback signal from said resistance divider.

8. The integrated circuit (IC) of claim 6, wherein the voltage of said feedback signal from said resistance divider is determined by the voltage at said output port which is buffered by said buffered amplifier and then divided by said resistance divider.

9. The integrated circuit (IC) of claim 6, wherein said plurality of n channel MOSFETs and said plurality of p channel MOSFETs acts as a current mirroring circuit.

10. The integrated circuit (IC) of claim 6, wherein said voltage-to-current converter converts the voltage from the output of said parametric pin measurement unit into a first current flowing to plurality of n channel MOSFETs through the first output and a second current flowing to the plurality of p channel MOSFETs through the second output.

11. The integrated circuit (IC) of claim 6, wherein at least one of said plurality of n channel MOSFETs and at least one of said plurality of p channel MOSFETs are gate-drain connected.

12. The integrated circuit (IC) of claim 6, wherein as the voltage from the output of said parametric pin measurement unit increases, the first current increases and drives the voltage at the output port higher.

13. The integrated circuit (IC) of claim 6, wherein as the voltage from the output of said parametric pin measurement unit decreases, the second current increases and drives the voltage at the output port lower.

14. A method for measuring a high current in an integrated circuit (IC) utilizing a parametric pin measurement unit, the method comprising the steps of:

a) configuring the integrated circuit (IC) with the parametric pin measurement unit having a first amplifier and a second amplifier with the output terminal of the second amplifier applied to the input terminals of the first amplifier through a common resistor, a voltage-to-current converter connected to an output of the parametric pin measurement unit, the voltage-to-current converter having a first output and a second output, a plurality of n channel MOSFETs connected to the first output of the voltage-to-current converter, a plurality of p channel MOSFETs connected to the second output of the voltage-to-current converter, a buffered amplifier connected to an output port between the plurality of n channel MOSFETs and the plurality of p channel MOSFETs and a resistance divider having a first resistor and a second resistor connected to the output of the buffered amplifier, the resistance divider provides a feedback signal to the negative terminal of the second amplifier;

b) applying a forced voltage VFORCE to the positive terminal of the second amplifier to provide a forced output voltage DOUT;

c) measuring the voltage MI_OUT at the output terminal of the first amplifier of the parametric pin measurement unit;

d) calculating the output current IOUT of the parametric pin measurement unit;

e) measuring the voltage DOUT_HV at the output port between the plurality of n channel MOSFETs and the plurality of p channel MOSFETs; and f) calculating the current IOUT_HV at the output port from the measured voltage at MI_OUT, wherein MI_OUT is determined by I_DOUT.

15. The method of claim 14, wherein the forced output voltage DOUT is determined by a feedback voltage EXT_SENSE from the resistance divider.

16. The method of claim 14, wherein the feedback voltage EXT_SENSE is given by the formula:

$$EXT\_SENSE = DOUT\_HV * 1 * R1/(R1+R2).$$

17. The method of claim 14, wherein the second amplifier provides the forced output voltage DOUT until VFORCE=EXT_SENSE.

18. The method of claim 14, wherein the voltage DOUT_HV is given by the formula:

$$DOUT\_HV = VFORCE * (R1+R2)/R1.$$

19. The method of claim 14, wherein the output terminal voltage MI_OUT of the first amplifier is given by MI_OUT=IRSENSE*RSENSE, where RSENSE is the common resistor and IRSENSE is the current through the common resistor RSENSE.

20. The method of claim 14, wherein the current IOUT_HV at the output port is given by the formula:

$$IOUT\_HV = MI\_OUT/RSENSE.$$

21. The method of claim 14, wherein IOUT_HV flows in DOUT and is measured by RSENSE and instrument amplifier at MI_OUT, and wherein Q3P/Q4P and Q3N/Q3P are scaled such that IOUT_HV is a multiple of the measured current, thereby allowing scaling.

22. An integrated circuit (IC) for a high voltage measuring range, comprising:

a parametric pin measurement unit ("PPMU") having a first amplifier and a second amplifier, an output terminal of the first amplifier connected to a negative terminal of the second amplifier and the output terminal of the second amplifier connected to the input terminals of the first amplifier through a common resistor connected therebetween, said PPMU having an output force terminal;

a PPMU high voltage extension, including:

a voltage-to-current converter connected to said output force terminal of said PPMU, the voltage-to-current converter having a first output and a second output;

a plurality of n channel MOSFETs connected to the first output of said voltage-to-current converter;

a plurality of p channel MOSFETs connected to the second output of said voltage-to-current converter;

a buffered amplifier connected to an output port between said plurality of n channel MOSFETs and said plurality of p channel MOSFETs; and a resistance divider having a first resistor and a second resistor connected to the output of said buffered amplifier and having an output connected to a terminal of said PPMU;

whereby a voltage representing a desired output current (IFORCE) is applied to the positive terminal of said second amplifier to produce a forced current at the output of said PPMU and output voltage in a range exceeding the range of said PPMU can be measured from the output port between said plurality of n channel MOSFETs and said plurality of p channel MOSFETs.

23. The integrated circuit (IC) of claim 22, wherein the voltage (IFORCE) applied to produce a forced current depends on the feedback voltage MI_OUT from the output terminal of said first amplifier.

24. The integrated circuit (IC) of claim 22, wherein the feedback voltage EXT_SENSE from said resistance divider is determined by the voltage at the output port which is buffered by said buffered amplifier and then divided by said resistor divider.

25. The integrated circuit (IC) of claim 22, wherein the feedback voltage EXT_SENSE is kept open.

26. The integrated circuit (IC) of claim 22, wherein said plurality of n channel MOSFETs and said plurality of p channel MOSFETs acts as a current mirroring circuit.

27. The integrated circuit (IC) of claim 22, wherein said voltage-to-current converter converts the voltage from the output of said PPMU into a first current flowing to said plurality of n channel MOSFETs through said first output and a second current flowing to said plurality of p channel MOSFETs through said second output.

28. The integrated circuit (IC) of claim 22, wherein at least one of said plurality of n channel MOSFETs and at least one of said plurality of p channel MOSFETs are gate-drain connected.

29. The integrated circuit (IC) of claim 22, wherein when the voltage from the output of said PPMU increases, the first current increases thereby increasing current flowing to said plurality of n channel MOSFETs.

30. The integrated circuit (IC) of claim 22, wherein when the voltage from the output of said PPMU decreases, the second current increases thereby increasing current flowing to the plurality of p channel MOSFETs.

31. A method for forcing a current and measuring a voltage in an integrated circuit (IC) utilizing a parametric pin measurement unit, the method comprising the steps of:

a) configuring the integrated circuit (IC) with the parametric pin measurement unit having a first amplifier and a second amplifier with the output of the second amplifier applied to the input terminals of the first amplifier through a common resistor and an output terminal of the first amplifier connected to a negative terminal of the second amplifier, a voltage-to-current converter connected to an output of the parametric pin measurement unit, the voltage-to-current converter having a first output and a second output, a plurality of n channel MOSFETs connected to the first output of the voltage-to-current converter, a plurality of p channel MOSFETs connected to the second output of the voltage-to-current converter, a buffered amplifier connected to an output port between the plurality of n channel MOSFETs and the plurality of p channel MOSFETs and a resistance divider having a first resistor and a second resistor connected to the output of the buffered amplifier and having an output applied to a terminal of the second amplifier of parametric pin measurement unit;

b) applying a forced voltage IFORCE to the positive terminal of the second amplifier to provide a forced output current through the common resistor RSENSE;

c) measuring the voltage MI_OUT at the output terminal of the first amplifier of the parametric pin measurement unit;

d) varying IFORCE to get a forced output current IOUT_HV, wherein RSENSE forces MI_OUT to equal IFORCE;

e) calculating the output current IOUT of the parametric pin measurement unit;

f) measuring the feedback voltage EXT_SENSE from the resistance divider; and g) calculating the voltage DOUT_HV from EXT_SENSE.

32. The method of claim 31, wherein the forced output current IOUT depends on the voltage MI_OUT at the output terminal of the first amplifier.

33. The method of claim 31, wherein the feedback voltage EXT_SENSE is kept open.

34. The method of claim 31, wherein the second amplifier provides the forced output current IOUT when MI_OUT=IFORCE.

35. The method of claim 31, wherein equivalent current flows from the plurality of n channel MOSFETs and the plurality of p channel MOSFETs to the output port DOUT_HV.

36. The method of claim 31, wherein the feedback voltage EXT_SENSE is given by the formula:

$EXT\_SENSE = DOUT\_HV * 1 * R1/(R1+R2).$

37. The method of claim 31, wherein the forced current IOUT at the output of the parametric pin measurement unit is given by the formula:

$IOUT = IFORCE/RSENSE.$

38. The method of claim 31, wherein the output terminal voltage DOUT_HV is given by the formula:

$DOUT\_HV = EXT\_SENSE * (R1+R2)/R1.$

* * * * *